(12) United States Patent
Wang et al.

(10) Patent No.: US 7,745,315 B1
(45) Date of Patent: Jun. 29, 2010

(54) HIGHLY ALIGNED VERTICAL GAN NANOWIRES USING SUBMONOLAYER METAL CATALYSTS

(75) Inventors: George T. Wang, Albuquerque, NM (US); Qiming Li, Albuquerque, NM (US); J. Randall Creighton, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 75 days.

(21) Appl. No.: 11/866,684

(22) Filed: Oct. 3, 2007

(51) Int. Cl.
*H01L 21/205* (2006.01)
*C30B 25/00* (2006.01)
*C30B 29/38* (2006.01)
*C30B 29/60* (2006.01)

(52) U.S. Cl. .................. 438/503; 117/87; 117/95; 117/104; 117/106; 117/921; 117/952; 977/816; 977/891; 977/762

(58) Field of Classification Search .............. 117/87, 117/95, 101, 104, 106, 902, 921, 923, 952; 438/503, 479; 977/731, 816, 817, 821, 891, 977/762
See application file for complete search history.

(56) References Cited

U.S. PATENT DOCUMENTS

| 5,176,557 | A | * | 1/1993 | Okunuki et al. ............ 445/24 |
| 6,692,568 | B2 |  | 2/2004 | Cuomo et al. |
| 7,211,464 | B2 |  | 5/2007 | Lieber et al. |
| 7,358,160 | B2 | * | 4/2008 | Li et al. .................... 438/478 |
| 7,364,929 | B2 | * | 4/2008 | Terano et al. ............... 438/46 |
| 7,390,360 | B2 | * | 6/2008 | Shenai-Khatkhate et al. .. 117/84 |
| 7,407,872 | B2 | * | 8/2008 | Han et al. .................. 438/483 |
| 7,528,002 | B2 | * | 5/2009 | Samuelson et al. ........... 438/94 |
| 2002/0004254 | A1 | * | 1/2002 | Miki et al. ................. 438/46 |
| 2006/0073680 | A1 | * | 4/2006 | Han et al. ................. 438/479 |
| 2007/0224715 | A1 | * | 9/2007 | Terano et al. ............... 438/29 |
| 2009/0098343 | A1 | * | 4/2009 | Arena et al. ............... 428/172 |

OTHER PUBLICATIONS

George T. Wang et al, "Highly aligned, template-free growth and characterization of vertical GaN nanowires on sapphire by metal-organic chemical vapour deposition" Institute of Physics Publishing, Nanotechnology, vol. 17, (2006) pp. 5773-5780.
Tevye Kuykendall et al, "Metalorganic Chemical Vapor Deposition Route to GaN Nanowires with Triangular Cross Sections", Nano Letters (2003) vol. 3 No. 8 pp. 1063-1066.
Tevye Kuykendall et al "Crystallographic alignment of high-density gallium nitride nanowire arrays", Nature Publishing Group, Letters, Nature Materials, vol. 3 Aug. 2004, pp. 524-528.
Yat Li et al, "Dopant-Free GaN/AlN/AlGaN Radial Nanowire Heterostructures as High Electron Mobility Transistors", Nano Letters (2006) vol. 6 No. 7 pp. 1468-1473.
Zhaohui Zhong et al, "Synthesis of p-Type Gallium Nitride Nanowires for Electronic and Photonic Nanodevices", Nano Letters (2003) vol. 3 No. 3 pp. 343-346.

* cited by examiner

*Primary Examiner*—M. Wilczewski
(74) *Attorney, Agent, or Firm*—Carol I Ashby

(57) ABSTRACT

A method for forming vertically oriented, crystallographically aligned nanowires (nanocolumns) using monolayer or submonolayer quantities of metal atoms to form uniformly sized metal islands that serve as catalysts for MOCVD growth of Group III nitride nanowires.

8 Claims, 8 Drawing Sheets

HIGHLY ALIGNED VERTICAL GAN NANOWIRES USING SUBMONOLAYER METAL CATALYSTS

The United States Government has rights in this invention pursuant to Department of Energy Contract No. DE-AC04-94AL85000 with Sandia Corporation.

CROSS-REFERENCE TO RELATED APPLICATIONS

This application is related to a copending application Ser. No. 11/866,748, Highly Aligned Vertical GaN Nanowires Using Submonolayer Metal Catalysts," filed the same day as this application, which has the same inventors.

BACKGROUND OF THE INVENTION

This invention relates to a method of fabricating Group III nitride nanowires or nanocolumns that are vertically oriented with respect to a crystallographic template substrate, single-crystal, and free of threading dislocations.

The availability of substrate-bound high-density arrays of group III nitride columns or nanowires that are single crystal, free of threading dislocations, and vertically aligned with respect to the substrate would enable a wide range of applications in optoelectronics, electronics, field emitters, and sensors. Control of crystallographic orientation and growth direction are important properties for a method of fabricating suitable nanowires for many such applications.

Sapphire is the most common substrate for growing GaN heteroepitaxial films because it has the same crystal symmetry and is approximately lattice matched with GaN (lattice mismatch approximately 15% for c-plane sapphire and c-plane GaN). While this degree of lattice matching allows epitaxial growth, it also leads to a high density of threading dislocations in continuous GaN layers grown directly atop the sapphire substrate. The deleterious effects of threading dislocations on device performance in many applications have lead to the search for better alternative substrates. Alternative substrates that are sometimes used include substrates that are nearly lattice matched such as (111) γ-LiAlO$_2$ (0.9% mismatch) and (111) MgO. Most conventionally grown GaN is c-plane GaN grown on (0001) sapphire (c-plane). The c-plane GaN is polar and columns of c-plane GaN ideally form hexagonal prisms or hexagon-derived shapes that exhibit angles characteristic the hexagonal structure. Other commercially available sapphire substrates include a-plane (11$\bar{2}$0), m-plane (10$\bar{1}$0), and r-plane (1$\bar{1}$02) orientations. Nonpolar (11$\bar{2}$0) a-plane GaN has been grown on (1$\bar{1}$02) r-plane sapphire substrates, with [0001]$_{GaN}$∥[$\bar{1}$101]$_{sapphire}$ and [$\bar{1}$100]$_{GaN}$∥[11$\bar{2}$0]$_{sapphire}$ (M. D. Craven, S. H. Lim, F. Wu, J. S. Speck, and S. P. DenBaars, "Nonpolar (11$\bar{2}$0) a-plane Gallium nitride Thin films Grown on (1$\bar{1}$02) r-plane Sapphire: Heteroepitaxy and Lateral Overgrowth," Phys. Stat. Sol. (a), vol. 194 (2002). pp. 541-544). A selective epitaxy regrowth over a patterned SiO$_2$ mask was used to produce low-threading dislocation material in the regrown regions over the SiO$_2$ mask.

For applications where columnar GaN or GaN-based heterostructures including other nitrides such as AlN, AlGaN, AlGaInN, InGaN, and InN are required, direct growth of the columns on a suitable substrate without the use of a sacrificial template may be highly useful.

GaN nanowires have been reported using a technique where multi-layer Ni, Fe, or Au films (2-10 nm) are thermally evaporated onto silicon, c-plane sapphire, or a-plane sapphire and used as catalysts for metal-initiated metalorganic chemical vapor deposition. Metalorganic chemical vapor deposition (MOCVD) and substrate selection has been used to control the crystallographic growth directions of high-density arrays of gallium nitride nanowires. Kuykendall and coworkers report gallium nitride nanowires synthesized via metal-initiated MOCVD. Wires were prepared on silicon, c-plane sapphire, and a-plane sapphire substrates. The wires were formed via the vapor-liquid-solid (VLS) mechanism with gold, iron, or nickel as growth initiators and were found to have widths of 15-200 nm. Transmission electron microscopy (TEM) showed that the wires were single-crystalline and were oriented predominantly along the [210] or [110] directions. Wires growing along the [210] orientation were found to have triangular cross-sections (T. Kuykendall, P. Pauzauskie, S. Lee, Y. Zhang, J. Goldberger, and P. Yang, "Metalorganic Chemical Vapor Deposition Route to GaN Nanowires with Triangular Cross Sections," Nano Letters Vol. 3 (2003) pp. 1063-1066). The wires reported in this paper were not vertically oriented with respect to the substrate surface. Kuykendall and coworkers further report the epitaxial growth of wurtzite gallium nitride on (100) γ-LiAlO$_2$ and (111) MgO single crystal substrates resulting in the selective growth of nanowires in the orthogonal [1$\bar{1}$0] and [001] directions, exhibiting triangular and hexagonal cross-sections (T. Kuykendall, P. J. Pauzauskie, Y. Zhang, J. Goldberger, D. Sirbuly, J. Denlinger, and P. Yang, "Crystallographic alignment of high-density gallium nitride nanowire arrays," Nature Materials Vol. 3 (2004) pp 524-528). The wires reported in this paper were vertically oriented with respect to the substrate surfaces, with triangular cross-section wires (15-40 nm wide and 1-5 micrometer long) grown on (100) γ-LiAlO$_2$ and hexagonal cross-section wires grown on (111) MgO.

Lieber et al. U.S. Pat. No. 7,211,646 reports a method comprising growing a population of semiconductor nanowires catalytically from catalyst colloid particles. Laser vaporization of a composite target that is composed of a desired material (e.g. InP) and a catalytic material (e.g. Au) creates a hot, dense vapor which quickly condenses into liquid nanoclusters through collision with the buffer gas. Growth begins when the liquid nanoclusters become supersaturated with the desired phase and continues as long as the reactant is available. Growth terminates when the nanowires pass out of the hot reaction zone or when the temperature is turned down. Au is generally used as catalyst for growing a wide range of elongated nanoscale semiconductors. However, the catalyst is not limited to Au only. A wide rage of materials such as (Ag, Cu, Zn, Cd, Fe, Ni, Co . . . ) can be used as the catalyst. Generally, any metal that can form an alloy with the desired semiconductor material, but doesn't form more stable compound than the desired semiconductor with the elements of the desired semiconductor can be used as the catalyst. The key point of this process is that laser ablation generates liquid nanoclusters that subsequently define the size and direct the growth direction of the crystalline nanowires. The diameters of the resulting nanowires are determined by the size of the catalyst cluster, which in turn can be varied by controlling the growth conditions (e.g. background pressure, temperature, flow rate). For example, lower pressure generally produces nanowires with smaller diameters. Further diameter control can be done by using uniform diameter catalytic clusters. Laser ablation may be used as the way to generate the catalytic clusters and vapor phase reactant for growth of nanowires and other related elongated nanoscale structures, but fabrication is not limited to laser ablation. Many ways can be used to generate vapor phase and catalytic clusters for nanowire growth (e.g. thermal evaporation). Catalysts for LCG can be chosen in the absence of detailed phase diagrams by identifying metals in which the nanowire component elements are soluble in the liquid phase but that do not form solid compounds more stable than the desired nanowire phase; that is, the ideal metal catalyst should be physically active but chemically stable. From this perspective the noble metal Au should represent a good starting point for many materials. This laser-assisted catalytic growth (LGC) method of Lieber is readily extended to many different materials simply by producing solid targets of the material of interest and catalyst.

In the LGC method of Lieber, a pulsed laser is used to vaporize a solid target containing desired material and a catalyst, and the resulting liquid nanoclusters formed at elevated temperature direct the growth and define the diameter of crystalline nanowires through a vapor-liquid-solid growth mechanism. A key feature of this method is that the catalyst used to define 1D growth can be selected from phase diagram data and/or knowledge of chemical reactivity. A related approach termed solution-liquid-solid phase growth has been used by Buhro and coworkers to prepare nanowires of several III-V materials in solution, although not nitrides. LCG using a GaN/Fe target produces a high yield of nanometer diameter wire-like structures. A typical FE-SEM image of the product produced by LCG (FIG. 20A of Lieber et al., U.S. Pat. No. 7,211,464) shows that the product consists primarily of 1D structures with diameters on the orders of 10 nm and lengths greatly exceeding 1 micrometer. (The wires in FIG. 20A are not vertically oriented with respect to a substrate, but appear randomly distributed thereon and recumbent.) However, Au exhibits poor solubility of N and thus may not transport N efficiently to the liquid/solid growth interface. Consistent with this analysis, Lieber et al. reported being unable to obtain GaN nanowire using the Au catalyst.

The patent of Cuomo and coworkers (J. J. Cuomo, N. M Williams, A. D. Hanser, E. P. Carlson, and D. T. Thomas, U.S. Pat. No. 6,692,568) reports a method utilizing sputter transport techniques to produce arrays or layers of self-forming, self-oriented columnar structures characterized as discrete, single-crystal Group III nitride posts or columns on various substrates. The columnar structure is formed in a single growth step, and therefore does not require processing steps for depositing, patterning, and etching growth masks. A Group III metal source vapor is produced by sputtering a target for combination with nitrogen supplied from a nitrogen-containing source gas. The III/V ratio is adjusted or controlled to create a Group III metal-rich environment within the reaction chamber conducive to preferential column growth.

Wang and coworkers have reported the growth of well aligned, vertically oriented GaN nanowires on (1$\bar{1}$02) r-plane sapphire wafers via metal-organic chemical vapor deposition using nickel nitrate catalyst. This paper reports that the degree of alignment and size uniformity of the nanowires is highly dependent on the nickel nitrate catalyst concentration used. This paper (G. T. Wang, A. A. Talin, D. J. Werder, J. R. Creighton, E. Lai, R. J. Anderson, and I. Arslan, "Highly aligned, template-free growth and characterization of vertical GaN nanowires on sapphire by metal-organic chemical vapour deposition," Nanotechnolotgy, vol. 17 (2006) pp 5773-5780) is incorporated herein by reference.

BRIEF DESCRIPTION OF THE DRAWINGS

The accompanying drawings, which are incorporated in and form part of the specification, illustrate some embodiments of the present invention and, together with the description, serve to explain the principles of the invention.

DETAILED DESCRIPTION OF THE INVENTION

Figure 1:
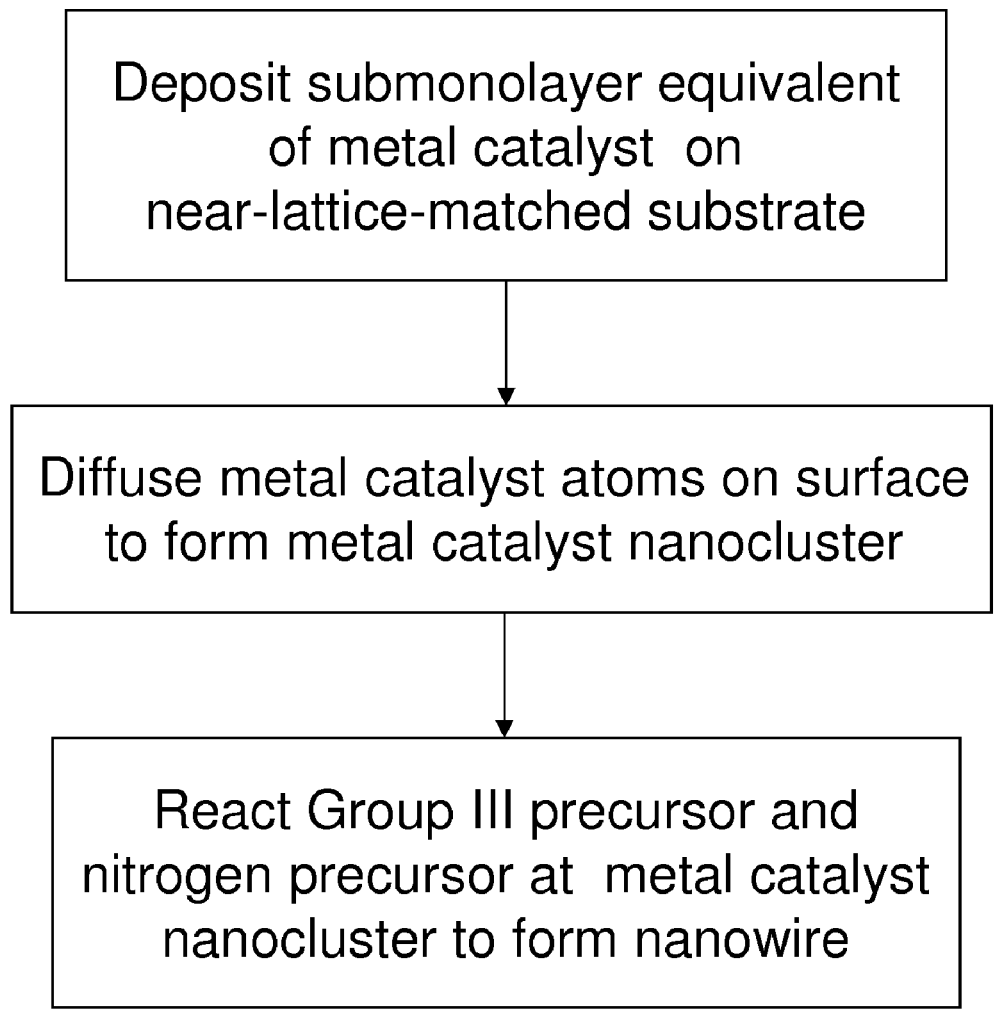
FIG. 1 is a flowchart that illustrates the steps of the process for the growth of nanocolumns according to one embodiment of the present invention.

This invention comprises a method for forming vertically oriented, crystallographically aligned nanowires (nanocolumns) using approximately a monolayer or submonolayer quantities of metal atoms to form uniformly sized metal islands that serve as catalysts for MOCVD growth of Group III nitride nanowires. Approximately a single monolayer or a submonolayer quantity of metal is deposited on a crystalline substrate with a lattice constant suitable for epitaxial growth of the desired Group III nitride material. The crystalline substrate serves as a crystallographic template substrate. The metal is selected from metals suitable for use as catalysts for Group III nitride column or wire growth by a vapor-liquid-solid (VLS) mechanism. The temperature of the substrate is elevated, thereby causing surface diffusion of the metal atoms to form discrete metal nanoclusters on the substrate surface. Reaction of a Group III atom precursor and a nitrogen precursor at each metal nanocluster leads to growth of Group III nitride nanocolumns whose distribution is directed by the distribution of nanoclusters. FIG. 1 illustrates an embodiment of this invention.

Figure 2:
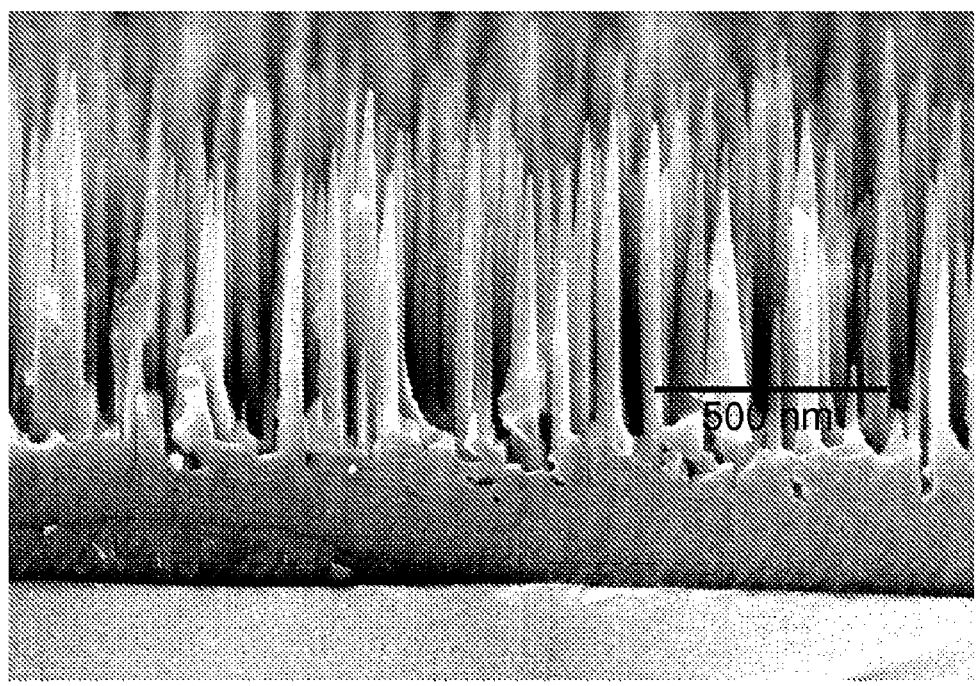
FIG. 2 illustrates an array of GaN nanocolumns grown on r-plane sapphire using Ni nanoclusters from a 0.8 Å-equivalent Ni deposition.

FIG. 2 presents a scanning electron micrograph (SEM) of an array of GaN nanowire columns grown using an embodiment of this method of this invention. A submonolayer of Ni (approximately 0.8 Angstroms equivalent amount) was deposited on an r-plane sapphire substrate to serve as catalyst for the growth of the nanocolumns in FIG. 2. The deposition was performed using an electron-beam evaporator capable of precise deposition rates equivalent to approximately 0.05 Ångstroms/second, as determined by mass measurement with a quartz-crystal microbalance. The illustrative embodiments of this invention use this e-beam evaporator for metal deposition; however, other metal deposition techniques may be used if they can provide sufficiently precise control of the amount of metal deposited on the surface to enable approximately monolayer and submonolayer metal deposition. For example, deposition of a metal salt from a sufficiently dilute solution to provide approximately a monolayer or submonolayer of metal after reduction of the salt may also be used. Examples of suitable salts include but are not restricted to $Ni(NO_3)_2$, and NiO. Since the atomic diameter of a nickel atom is 3.24 Angstroms, a deposition weight equivalent to 0.8 Å thickness corresponds to less than a monolayer of Ni atoms on the surface. A deposition weight equivalent to 3.0 Å thickness is approximately equal to slightly less than a monolayer. The nominal thickness of 3.0 Å is ascribed to a layer resulting form a deposition weight equivalent to 3.0 Å thickness.

In various embodiments, approximately a monolayer or less of metal is deposited. If the metal is exposed to an oxidizing atmosphere so that the metal oxidizes, heating under a reducing atmosphere can restore the metal to the elemental state suitable for use as a catalyst. If the metal is deposited in a positive oxidation state as part of a metal salt, heating under a reducing atmosphere can reduce the metal to the elemental state.

Figure 3:
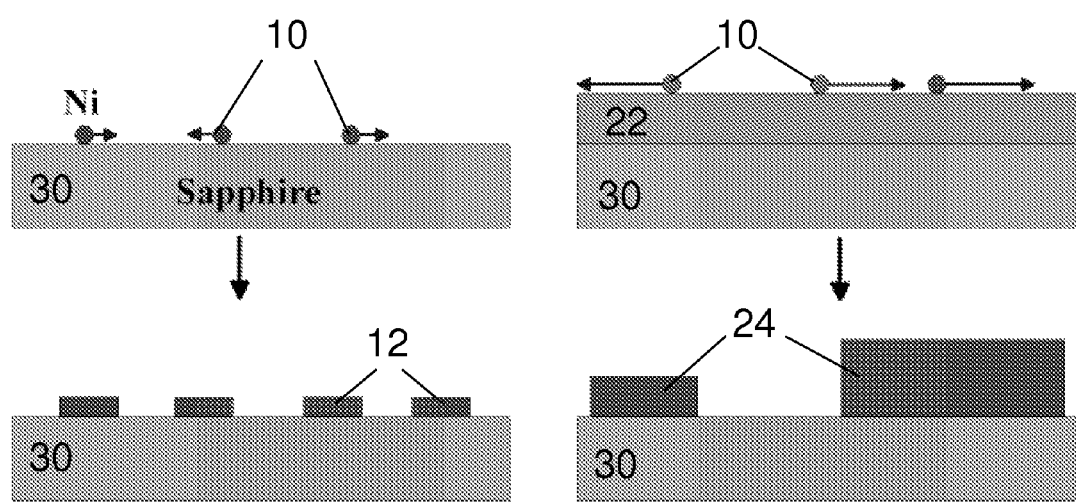
FIG. 3 illustrates the surface diffusion of a submonolayer of a metal on a substrate, resulting in nanoclusters that are substantially uniform in size and spacing, and the diffusion of metal ions on the surface of a multilayer metal film resulting in a greater range of nanocluster size and nonuniformity in spacing.
Figure 4:
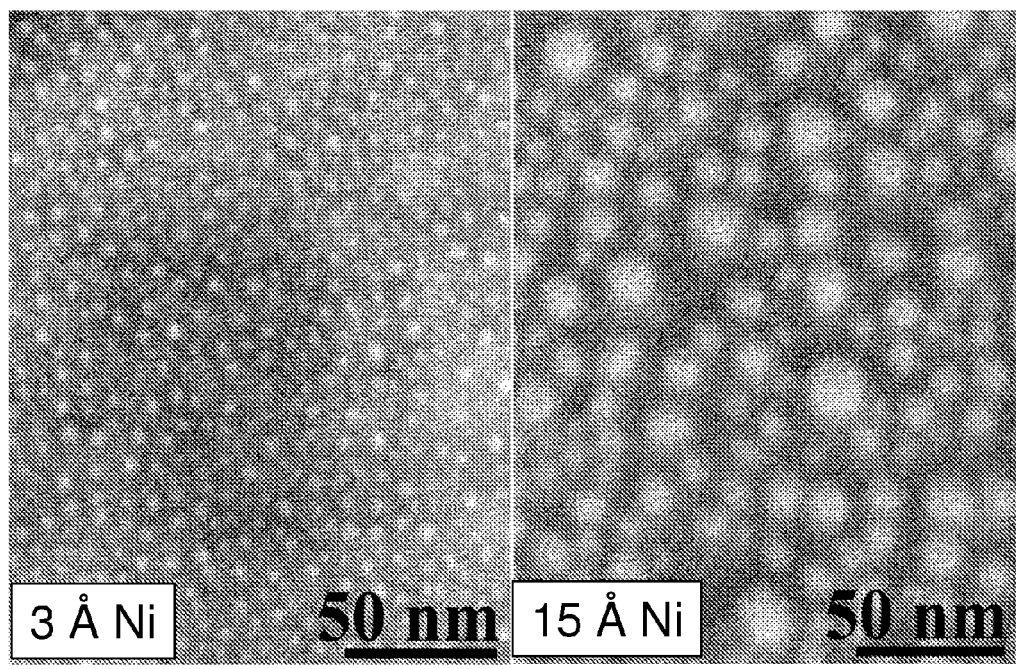
FIG. 4 presents scanning electron micrographs (SEMs) of annealed sapphire surfaces whereon either 3 Å (approximately a monolayer) or 15 Å (approximately 5 monolayers) of Ni has been deposited.

During heating, metal atoms can diffuse on the surface of the substrate to form metal nanoclusters. The size, shape, and distribution of nanoclusters will depend on the initial supply of metal atoms on the surface. FIG. 3 schematically illustrates the surface diffusion of metal atoms 10 on a surface with a submonolayer of metal in contrast with the surface diffusion of metal atoms 10 on a surface with sufficient metal to form more than approximately a monolayer 22, where most metal atoms are interacting directly with other metal atoms instead of with the substrate surface. The activation energy for the diffusion of Ni on sapphire is appreciably higher than for the diffusion of Ni on Ni (6.26 eV vs. 0.063 eV). The much slower diffusion of Ni on sapphire results in the formation of fairly uniform Ni nanoclusters 12 fairly evenly dispersed on the sapphire 30 surface. In contrast, the high diffusion rate of Ni on Ni permits the formation of larger, more widely spaced metal clusters 24. FIG. 4 presents a pair of SEMs showing Ni nanoclusters formed upon annealing a 3 Å deposit of Ni on sapphire, where Ni is diffusing on sapphire, and upon annealing a 15 Å deposit, where Ni is diffusing on Ni. The metallized substrates were heated to 800° C. in $H_2$. The temperature was allowed to stabilize for 3 minutes; then the substrates were allowed to cool to room temperature under $H_2$. The Ni nanoclusters resulting from the 3 Å deposition are smaller, more uniform in size, and more uniformly distributed on the surface than those resulting from the 15 Å deposition. Alternative temperatures may be used provided they are sufficiently high to enable diffusion of the metal atoms to form the metal nanoclusters.

Figure 5:
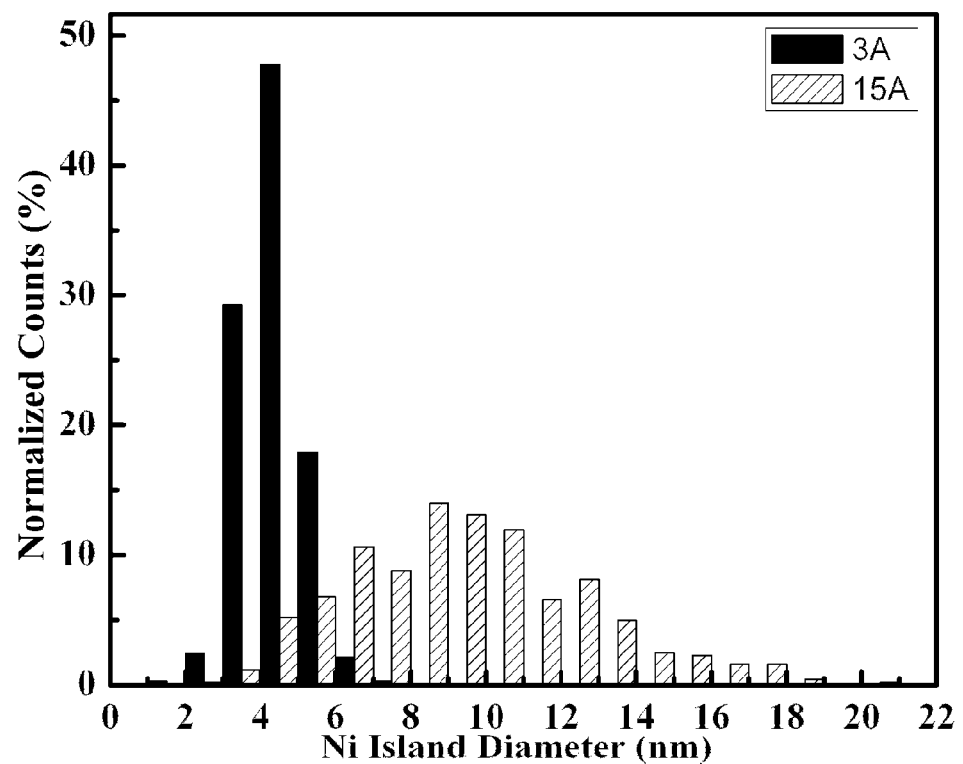
FIG. 5 presents a histogram illustrating the relative numbers of Ni nanoclusters (Ni islands) of different sizes present on an annealed sapphire surface whereon either 3 Å or 15 Å of Ni has been deposited.

FIG. 5 illustrates the range of nanocluster sizes obtained after heating slightly less than approximately one monolayer of deposited Ni (3 Å) and approximately 5 monolayers (15 Å) of deposited Ni. The range of nanocluster sizes is quite narrow and strongly peaked for the near-monolayer deposition, while a much wider range of nanocluster sizes results with the multilayer deposition. Since nanowires grown by a vapor-liquid-solid mechanism generally approximate the size of the metal catalyst, a more uniform distribution of nanocolumn diameters will result from the more uniform nanoclusters obtained with a monolayer or less of metal.

The metal nanoclusters may be formed by heating the metallized substrate in the reaction chamber where subsequent Group III nitride growth is to be performed or they may be formed by heating the metallized substrate in a different chamber before transfer into the reaction chamber.

In the embodiment illustrated in FIG. 2, the equivalent of approximately 0.8 Å of Ni was deposited on an r-plane sapphire surface. Following deposition, the wafer was transferred to a rotating-disc cold-wall MOCVD reactor. After heating the Ni-coated wafer to the desired growth temperature of 780° C. in flowing $H_2$, 50 sccm of $H_2$ bubbled through a trimethylgallium (TMG) bubbler at 18° C. and 2000 sccm of ammonia were introduced into the reactor, which was held at 140 Torr. Under these conditions, the averaged GaN nanowire growth rate was determined to be approximately 1 micrometer/min.

Alternative MOCVD reactor designs may be used instead of the rotating-disc cold-wall design employed in the illustrative embodiments described herein. Alternative sources of gallium may also be used, as know to those skilled in the GaN MOCVD art; some alternative gallium atom precursor molecules include but are not restricted to trimethyl gallium (TMG), triethyl gallium (TEG), gallium-containing hydrocarbon compounds, gallium, gallium oxide, and gallium nitride. Alternative sources of nitrogen may also be used; some alternative nitrogen precursor molecules include but are not restricted to nitrogen gas and ammonia. A ratio of nitrogen precursor molecules to gallium atom precursor molecules that is greater than 1 is employed in various embodiments. Alternative catalyst metal atoms that are suitable for catalyzing GaN growth by the VLS method may be used: alternative examples include but are not restricted to Ni, Au, Pt, Ga, In, Co, and Fe. Alternative substrates include substrates comprising a surface layer of epitaxially grown GaN.

Alternative temperatures for the growth of GaN may be use; temperatures selected from within the range of approximately 650° C. to approximately 850° C. may be employed.

Figure 6:
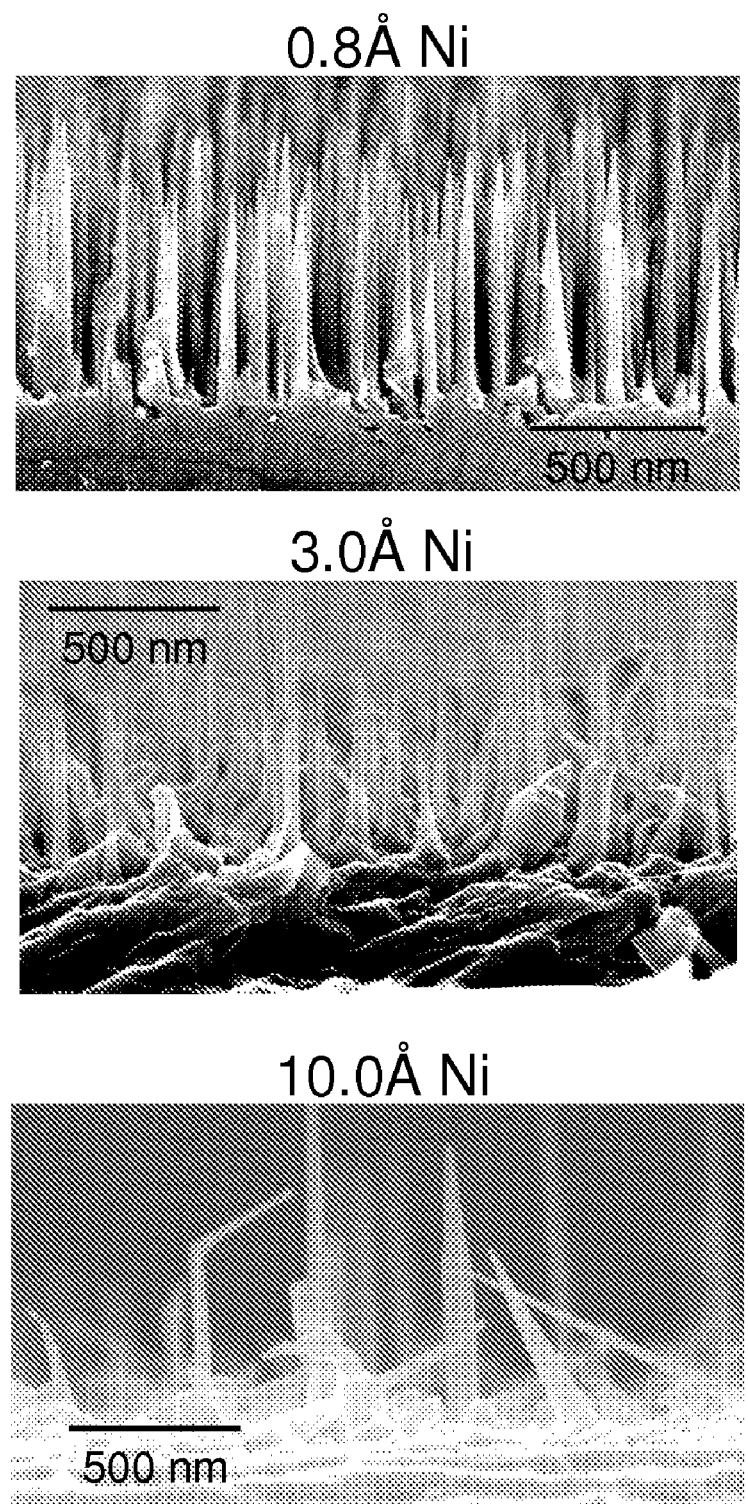
FIG. 6 presents SEMs of GaN nanocolumns (nanowires) grown on r-plane sapphire using submonolayer (0.8-Å-equivalent) Ni deposition, approximately monolayer (3.0-A-equivalent) Ni deposition and multilayer (10.0-Å-equivalent) Ni deposition.
Figure 7:
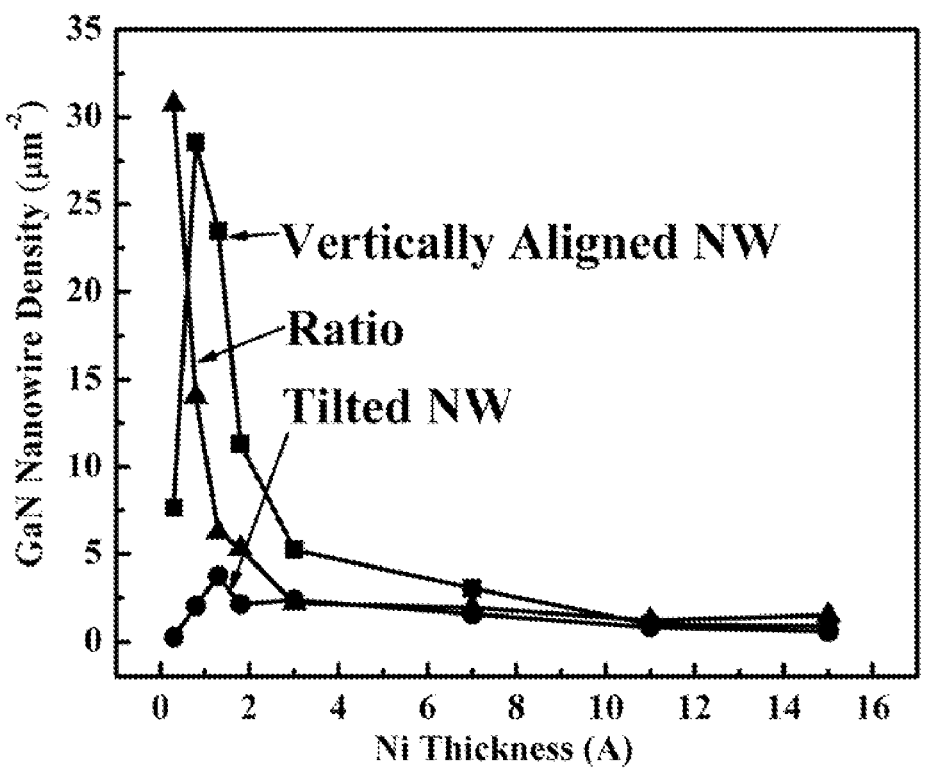
FIG. 7 illustrates the equivalent Ni film thickness dependence of the areal density of GaN nanowires and the ratio of vertically aligned nanowires to tilted nanowires. Growth temperature was 800° C.

FIGS. 6 and 7 illustrates some effects of submonolayer, approximately monolayer, and multilayer metal deposition. FIG. 6 presents a set cross-sectional SEMs of GaN nanowires (nanocolumns) grown on r-plane sapphire at a growth temperature of approximately 780° C. using a growth time of 60 seconds. FIG. 6a presents an SEM of nanocolumns grown using a submonolayer Ni film to form the nanocluster catalysts (0.8 Å equivalent Ni deposition). The array of columns is very dense and highly vertically oriented. FIG. 6b presents an SEM of nanocolumns grown using approximately a monolayer of Ni film to form the nanocluster catalysts (3.0 Å equivalent Ni deposition). The nanocolumns are quite dense and mostly vertically aligned. FIG. 6c presents an SEM of nanocolumns grown using approximately 3 monolayers of Ni atoms (10.0 Å Ni deposition). In this multilayer case, the nanocolumns are relatively sparsely distributed and display a greater range of angles than in the monolayer and submonolayer cases.

FIG. 7 illustrates the GaN nanowire areal density as a function of the deposited equivalent Ni thickness. For deposits of less than approximately one monolayer, the number of vertically oriented nanowires and the ratio of vertically aligned to tilted nanowires increases markedly as compared to the number of nanowires obtained with Ni depositions in excess of one monolayer. This reflects the higher density and greater size uniformity of the nanoclusters formed from near-monolayer and submonolayer metal films compared to those formed with multilayer metal deposits.

Figure 8:
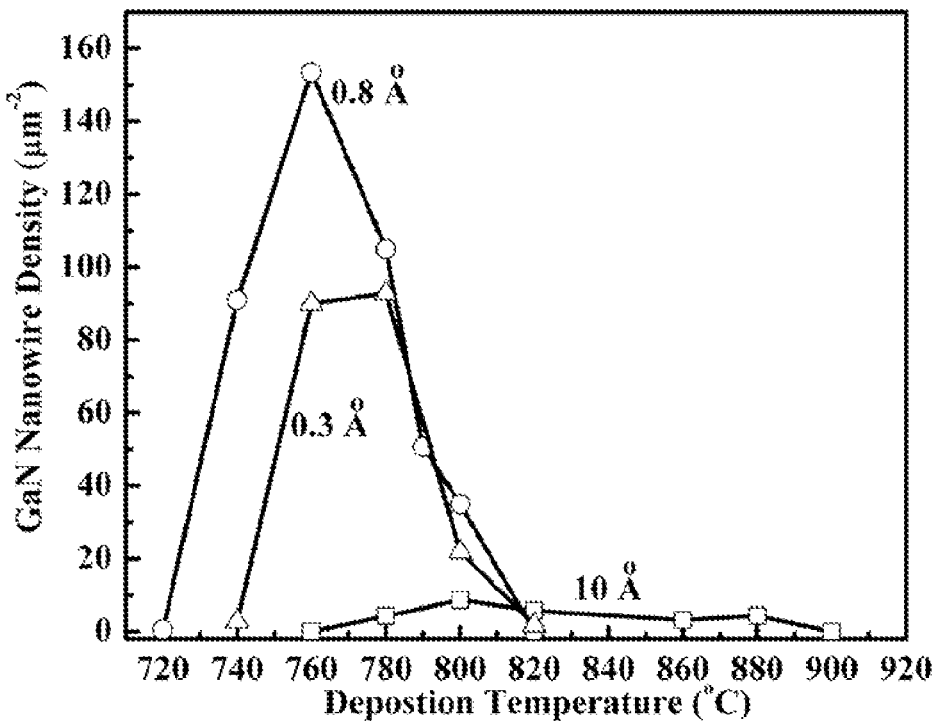
FIG. 8 illustrates the dependence of the areal density of GaN nanowires on growth temperature and equivalent Ni film thickness.

FIG. 8 illustrates the temperature dependence of the nanowire density obtained with 0.3, 0.8, and 10 Å equivalent Ni thickness films. Submonolayer films correspond to more pronounced temperature dependences for the nanowire density than is obtained with multilayer films and to high densities of columns at lower temperatures with submonolayer films than with multilayer films.

Figure 9:
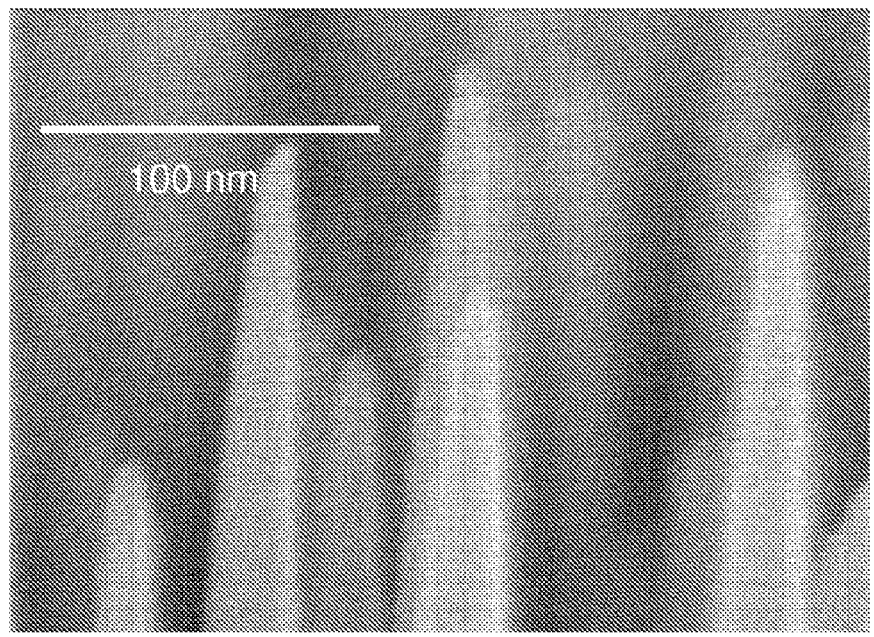
FIG. 9 presents an SEM of GaN nanocolumns grown off r-plane sapphire using Ni metal nanoclusters formed using a 0.8 Å equivalent Ni metal deposition.
Figure 10:
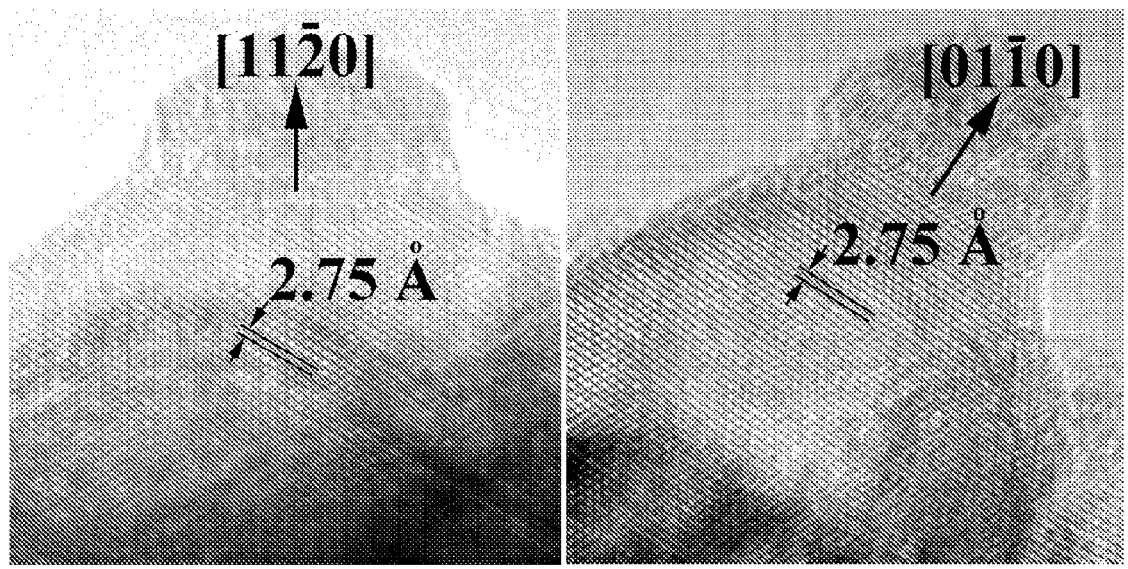
FIG. 10 presents a high-resolution transmission electron micrograph (TEM) of a vertical nanocolumn and a tilted nanocolumn, each micrograph showing a catalytic Ni nanocluster at the apex of a tapered nanocolumn.

FIG. 9 presents an SEM of GaN nanocolumns grown off r-plane sapphire using Ni metal nanoclusters formed using a 0.8 Å equivalent Ni metal deposition. Estimated Ni nanocluster sizes are in the range of 3-5 nm. The nanocolumns are somewhat wider at the tip than the catalytic nanoparticle, as shown in the high resolution TEMs for a vertical and an angled nanocolumn in FIG. 10. Lateral growth of the nanowire by an uncatalyzed mechanism, which is relatively slow compared to the metal-catalyzed rate at a growth temperature near 800° C., leads to a sharp but tapered column profile. The columns possess a triangular cross-section consistent with crystallographic alignment with the r-plane sapphire substrate. GaN nanocolumns grown by the method of this invention are shown by TEM to be single crystal and free of threading dislocations.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating vertically oriented nanowires on a substrate, the method comprising:

depositing up to approximately a monolayer of catalyst metal atoms on a surface of a crystallographic template substrate;

heating the crystallographic template substrate to induce surface diffusion of the catalyst metal atoms to form a plurality of metal nanoclusters; and reacting gallium atom precursor molecules and nitrogen precursor molecules at the metal nanoclusters to form vertically oriented single-crystal gallium nitride nanowires epitaxially aligned with the crystallographic template substrate, wherein the ratio of nitrogen precursor molecules to gallium atom precursor molecules is greater than 1.

2. The method of claim 1, wherein a submonolayer of catalyst metal atoms is deposited using a metal evaporation technique and wherein a nominal thickness of catalyst metal is less than or equal to approximately 3 Å.

3. The method of claim 1, wherein the step of heating the crystallographic template substrate is performed under a reducing atmosphere.

4. The method of claim 1, wherein the gallium atom precursor molecules are selected from the group consisting of trimethylgallium, triethylgallium, gallium-containing hydrocarbon compounds, gallium, gallium oxide, and gallium nitride.

5. The method of claim 1, wherein the nitrogen precursor molecules are selected from the group consisting of ammonia, and nitrogen.

6. The method of claim 1, wherein the catalyst metal atoms are selected from the group consisting of Ni, Au, Pt, Ga, In, Co, and Fe.

7. The method of claim 1, wherein the step of reacting is performed at a temperature between approximately 650° C. and approximately 850° C.

8. The method of claim 1, wherein the crystallographic template substrate is selected from the group consisting of r-plane sapphire and a substrate comprising a surface layer of epitaxially grown GaN.

* * * * *